(12) United States Patent
Dona et al.

(10) Patent No.: US 9,812,285 B2
(45) Date of Patent: Nov. 7, 2017

(54) HOLDER ASSEMBLY FOR COOPERATING WITH A NANOREACTOR AND AN ELECTRON MICROSCOPE

(71) Applicant: FEI Company, Hillsboro, OR (US)

(72) Inventors: Pleun Dona, Veldhoven (NL); Luigi Mele, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 15/218,512

(22) Filed: Jul. 25, 2016

(65) Prior Publication Data

US 2017/0213691 A1 Jul. 27, 2017

(30) Foreign Application Priority Data

Jan. 27, 2016 (EP) .................................... 16152964

(51) Int. Cl.
| | |
|---|---|
| *H01J 37/30* | (2006.01) |
| *G21K 5/08* | (2006.01) |
| *G01N 21/05* | (2006.01) |
| *H01J 37/16* | (2006.01) |
| *H01J 37/20* | (2006.01) |

(52) U.S. Cl.
CPC .............. *H01J 37/16* (2013.01); *H01J 37/20* (2013.01)

(58) Field of Classification Search
USPC ... 250/310, 311, 307, 440.11, 441.11, 443.1, 250/492.1, 492.2, 492.3, 526
See application file for complete search history.

(56) References Cited

U.S. PATENT DOCUMENTS

| | | | | | |
|---|---|---|---|---|---|
| 5,229,607 | A | * | 7/1993 | Matsui ................... | B82Y 35/00 250/310 |
| 5,326,971 | A | * | 7/1994 | Theodore ................ | H01J 37/20 250/311 |
| 7,723,701 | B1 | * | 5/2010 | Walck .................... | B01L 3/508 220/8 |
| 7,888,655 | B2 | * | 2/2011 | van Gaasbeek ........ | H01J 37/20 250/442.11 |
| 7,989,778 | B2 | * | 8/2011 | Oetelaar ............... | H01J 37/185 250/440.11 |

(Continued)

FOREIGN PATENT DOCUMENTS

EP 2631929 A1 8/2013

*Primary Examiner* — Bernard Souw
(74) *Attorney, Agent, or Firm* — Scheinberg & Associates, P.C.; Michael O. Scheinberg

(57) ABSTRACT

Presented is a holder assembly for cooperating with a nanoreactor and an electron microscope. The holder assembly has a distal end for holding the nanoreactor. The volume has a fluid inlet and outlet. The holder assembly has fluid supply and outlet tubes which in working are connected to the fluid inlet and outlet of the nanoreactor. In working, the connection between the fluid inlet and outlet and the respective supply and outlet tubes are sealed by sealing elements. The holder assembly has a recess which, when the nanoreactor is attached and the holder is inserted into the evacuated portion of an electron microscope, forms a sealed pre-vacuum volume between the holder and the nanoreactor, with the pre-vacuum volume being evacuated via a pre-vacuum channel such that any fluid leakage is pumped away and does not enter the evacuated part of the electron microscope.

19 Claims, 1 Drawing Sheet

(56) References Cited

U.S. PATENT DOCUMENTS

Figure 1:
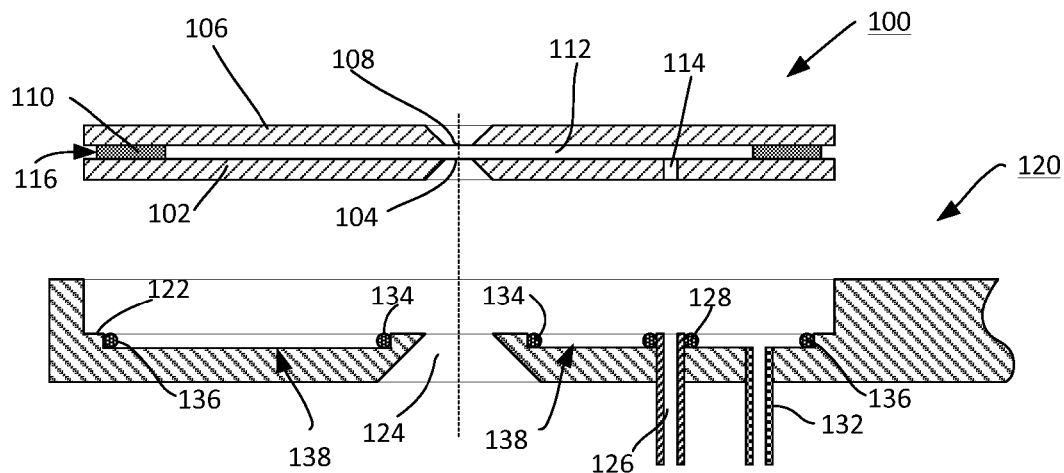

| | | | | |
|---|---|---|---|---|
| 8,178,851 B2* | 5/2012 | Deshmukh | ......... | G01N 21/0303 |
| | | | | 250/311 |
| 8,698,098 B2* | 4/2014 | Deshmukh | ............ | G01N 21/01 |
| | | | | 250/440.11 |
| 8,829,469 B2* | 9/2014 | Damiano, Jr. | .......... | H01J 37/20 |
| | | | | 250/440.11 |
| 9,162,211 B2* | 10/2015 | Van Veen | ............. | B01J 19/0093 |
| 2007/0145289 A1* | 6/2007 | Chao | ...................... | H01J 37/20 |
| | | | | 250/440.11 |
| 2011/0097706 A1* | 4/2011 | van Veen | ............. | B01J 19/0093 |
| | | | | 435/5 |
| 2013/0213439 A1* | 8/2013 | Zandbergen | ............ | H01J 37/20 |
| | | | | 134/19 |

* cited by examiner

HOLDER ASSEMBLY FOR COOPERATING WITH A NANOREACTOR AND AN ELECTRON MICROSCOPE

The invention relates to a holder assembly for cooperating with a nanoreactor and an electron microscope, the electron microscope in working irradiating the nanoreactor with a beam of electrons, said holder assembly having a distal end for holding the nanoreactor, the nanoreactor having a first flat layer with a first electron transparent window, and a second flat layer having a second electron transparent window, the first flat layer and the second flat layer enclosing an enclosed volume, the first electron transparent window aligned with the second electron transparent window, the first flat layer having a fluid inlet for entering a fluid into the enclosed volume, the distal end of the holder assembly in working placed in an evacuated part of the electron microscope, the nanoreactor in working attached to the distal end, the distal end having a central hole for passing the beam of electrons, said central hole in working aligned with the first electron transparent window and the second electron transparent window of the nanoreactor, the distal end having a fluid supply channel in working connected to the fluid inlet, the fluid supply channel supplying a fluid, the connection between the fluid inlet and the fluid supply channel in working sealed by a fluid supply sealing element.

Such a holder assembly is known from EP publication no. EP2631929A1. The known publication shows a nanoreactor in the form of an environmental cell having a fluid inlet and a fluid outlet. A holder assembly shows an interface where, when the environmental cell is attached to the holder, tubes are sealingly connected to the fluid inlet and the fluid outlet to apply fluid to and remove fluid from the environmental cell. The sealing is performed by tiny sealing members in the form of (elastomeric) O-rings on the holder assembly.

It is noted that in the context of this invention a nanoreactor is also called a nanocell, a microreactor, or an environmental cell. A flat surface in this context is also called a chip or a wafer.

A problem with said holder assembly is that the tiny sealing members are difficult to handle, and that often leakage occurs over the sealing members into the vacuum of the electron microscope.

The invention intends to provide a solution to that.

To that end the holder assembly comprises a recess that, when the nanoreactor is attached to the holder assembly, forms a sealed pre-vacuum volume between the distal end and the first flat layer, the pre-vacuum volume evacuated via a pre-vacuum channel ending in the recess, and the fluid supply sealing element is exposed to the evacuated pre-vacuum volume such that any leakage of the fluid via the fluid supply sealing element is pumped away via the pre-vacuum channel without entering the evacuated part of the electron microscope.

In an embodiment the distal end has a fluid outlet channel for exiting fluid from a fluid outlet of the nanoreactor, the fluid outlet for exiting fluid from the enclosed volume, in working the fluid outlet sealed to the fluid outlet channel with a fluid outlet sealing element, and the fluid outlet sealing element is exposed to the evacuated pre-vacuum volume such that any leakage of the fluid via the fluid outlet sealing element is pumped away via the pre-vacuum channel without entering the evacuated part of the electron microscope.

The prevacuum must have a pressure that is at least one order of magnitude, preferably a few orders of magnitude, lower than the pressure of the fluid. Thereby the leakage is one or more orders of magnitude lower than without the prevacuum. Also problems due to gas bursts are diminished.

In another embodiment the holder assembly is equipped to cooperate with a nanoreactor having a fluid outlet, the fluid outlet taking the form of a predetermined leak between the enclosed volume and the evacuated volume.

The predetermined leak can be formed by a porous (part of the) sealing member between the two flat surfaces, or by a small gap in the sealing member.

In a preferred embodiment the holder assembly is equipped to cooperate with a nanoreactor of which the first flat layer is sealed to the second flat surface by a sealing member, and the sealing member is exposed to the pre-vacuum such that any leakage of the fluid via the fluid outlet sealing element is pumped away without entering the evacuated part of the electron microscope.

The sealing member of the nanoreactor may be a permanent seal, for example a sealing member formed using frit techniques, or it may be a detachable sealing member, using, for example, an O-ring.

In another embodiment at least the fluid inlet sealing element is a sealing element comprising an elastomer.

The use of elastomers (such as rubber, synthetic rubbers, or such like) is well-known for seals, especially for O-rings and X-rings.

In a preferred embodiment the holder assembly further comprising electrical connections for connecting to connection pads on the nanoreactor.

Hereby electrical voltages can be applied to the enclosed volume, for example for biasing an electrode in the enclosed volume, applying a field over the enclosed volume, applying a heating current through a heater integrated on one or both chips, or connecting a sensor to a measuring tool connected to the holder assembly, for example measuring temperature, resistance, etc.

It is noted that a heater or sensor may also be formed on the side of the flat surfaces opposite to the enclosed volume.

In a further embodiment the electrical connections of the holder assembly are used to supply a heating current to the nanoreactor.

It is well-known to heat nanoreactors to a high temperature of, for example, 1000° C. This high temperature enables, for example, research on the behavior of catalysts at high temperature.

It is noted that also a holder assembly and a nanoreactor with a multitude of fluid inlet channels may be used so that the fluid only interact when they enter the enclosed volume.

The invention is now elucidated using figures, in which identical reference numerals indicate corresponding features.

Figure 2:
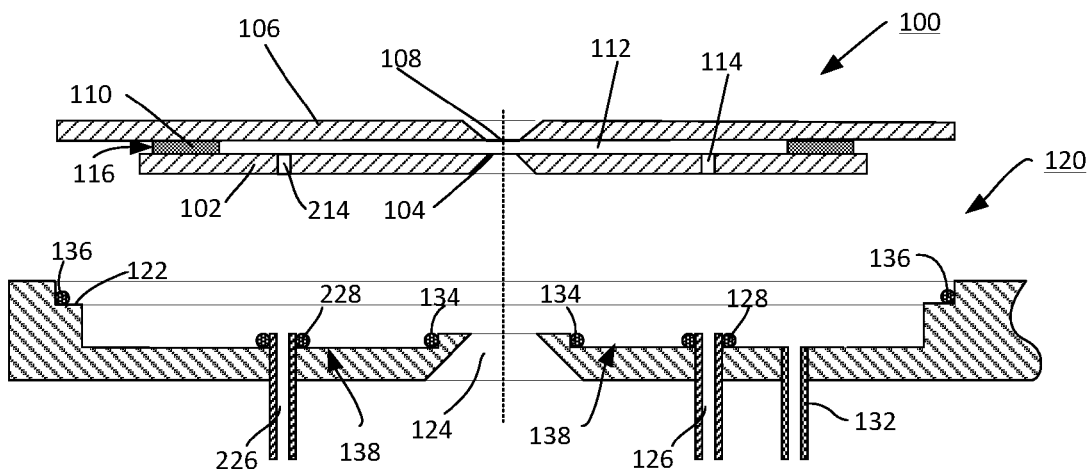

To that end:

FIG. 1 schematically shows the distal end of a holder and a nanoreactor,

FIG. 2 schematically shows another implementation of the distal end of a holder and a nanoreactor FIG. 1 schematically shows the distal end of a holder assembly and a nanoreactor.

A nanoreactor 100, also called a nanocell, a microreactor, or an environmental cell, is formed by two chips 102 and 106 attached to each other by a bond in the form of sealing element 110. Chip 102 comprises an electron transparent window 104 and chip 106 comprises an electron transparent window 108. The windows are aligned such that a beam of electrons impinging perpendicular to the chips can pass through both windows simultaneously. Between the two chips an enclosed volume 112 is formed, in which a fluid to be examined can be admitted via a fluid inlet 114.

The holder assembly 120 has a recess with a "floor" 122 in which the nanoreactor 100 fits. In said recess a further recess 138 in the form of an annulus is formed. The further recess is connected to a pre-vacuum tube 132. When the nanoreactor is attached on the holder assembly a pre-vacuum volume is formed, sealed by sealing members 134 and 136. A fluid inlet tube 126 protrudes through the pre-vacuum volume, said fluid inlet tube sealing on the nanocell with sealing member 128 when said nanocell is attached to the holder assembly. The holder assembly further comprises a central hole 124 that is, in working, aligned with the electron transparent windows 104 and 108 of the nanoreactor. Electrons passing through the electron transparent windows are therefore not intercepted by the holder assembly.

Any fluid that leaks from the fluid inlet tube over the sealing member 128 enters the pre-vacuum volume, where it is pumped away via pre-vacuum tube 132. The pumping means used to evacuate the pre-vacuum volume is one or more pumps from, for example, the group of turbo-molecular pumps, membrane pumps, drag pumps, or any other convenient type of pump. The pumping means do not have to achieve the same level of vacuum as normally maintained in the inside of an electron microscope (often 1 mPa or better), but only need to pump down to a pressure of, for example, 100 Pa. This results in a much reduced leak rate from the pre-vacuum volume over the sealing members 134 and 136 to the inside of the microscope.

FIG. 2 schematically shows another embodiment of the distal end of a holder and a nanoreactor.

FIG. 2 can be thought to be derived from FIG. 1.

The nanoreactor has a fluid inlet 114 and a fluid outlet 118 to enable a flow of the fluid through the nanoreactor, the two chips 102 and 106 have, contrary to the nanoreactor 100 shown in FIG. 1, a different size: chip 106 is larger than chip 102.

The holder assembly 120 has a recess with a "floor" 122. Chip 106 fits in this recess, and thereby the nanocell is aligned with respect to holder assembly 120. The sealing member 136 rests on this floor 122 and, in working, forms a seal with chip 106, while sealing member 134 seals on chip 102. Hereby a sealed prevacuum volume is formed. The holder assembly has not only a fluid inlet tube 126, but also a fluid outlet tube 226, said fluid outlet tube in working sealed on the nanoreactor with sealing member 228.

Any fluid leaking over sealing members 128 and 228 enters the pre-vacuum volume, where it is pumped away via pre-vacuum tube 132. Also fluid leaking from the seal between chip 102 and 106 at for example position 116 enters the pre-vacuum volume.

It is noted that the pumping from leakage over sealing element 110 enables the use of a detachable seal between the two chips, for example in the form of an O-ring.

It is further noted that the outlet may also take the form of a pre-defined leak at, for example, position 116, either by a small gap, a porous area, or such like. In that case fluid outlet tube 226, sealing member 228 and fluid outlet 118 may be absent.

It is also noted that this embodiment may seem to resemble U.S. Pat. No. 8,829,469B2, which shows two chips different size (diameter), that seal on a holder assembly with a shallow, wide recess and a deep, narrow recess. However, here the two chips are not sealed to each other, but just stacked, and fluid (gas) is allowed to enter the enclosed volume between the two chips from a volume surrounding the chip fitted in the deep, narrow recess.

It is worth mentioning that in the above embodiment reference is made to chips that are attached to each other with a seal. Such a seal can be a elastomeric O-ring, or for example a glass compound (a frit), or any detachable or non-detachable bond. It is also known to make the nanoreactor in one process, where from a chip or wafer a structure is built with a sacrificial chamber, where the sacrificial chamber is in the process removed/emptied to form the enclosed volume. Needless to say that, when forming the nanoreactors out of a wafer, the wafer needs to be divided in small parts, or chips.

Although the embodiments mention the use of chips, any body with a flat surface, for example a body made of glass, plastic, a semiconductor material, or such like, may be used. In this context these bodies are referred to as chips. It is implied that in this context a chip has at least one flat surface.

It is noted that in a preferred embodiment the holder assembly as shown in e.g. FIG. 1 or FIG. 2 is equipped with electrical contacts contacting conductive strips on one or both chips. Hereby electrical voltages can be applied, for example for biasing an electrode in the enclosed volume, applying a field over the enclosed volume, applying a heating current through a heater integrated on one or both chips, or connecting a sensor to a measuring tool connected to the holder assembly, for example measuring temperature, resistance, etc.

Attaching the nanoreactor to the distal end can take the form of attaching the two using a resilient member (a spring), by screwing the two together, etc.

Although in these embodiments the sealing members 134 and 136 are centered on the holder assembly, one or both can also be centered on the nanoreactor.

It is noted that in general the chips can have different forms, for example round chips, rectangular chips, or any other convenient form, The holder assembly should then be made to accommodate these forms, or to accommodate several forms (for example a holder assembly for use with round, rectangular or hexagonal chips/nanoreactors).

The invention claimed is:

1. A holder assembly for cooperating with a nanoreactor and an electron microscope, the electron microscope in working irradiating the nanoreactor with a beam of electrons, said holder assembly having a distal end for holding the nanoreactor, the nanoreactor having a first flat layer with a first electron transparent window, and a second flat layer having a second electron transparent window, the first flat layer and the second flat layer enclosing an enclosed volume, the first electron transparent window aligned with the second electron transparent window, the first flat layer having a fluid inlet for entering a fluid into the enclosed volume, the distal end of the holder assembly in working placed in an evacuated part of the electron microscope, the nanoreactor in working attached to the distal end, the distal end having a central hole for passing the beam of electrons, said central hole in working aligned with the first electron transparent window and the second electron transparent window of the nanoreactor, the distal end having a fluid supply channel in working connected to the fluid inlet, the fluid supply channel supplying a fluid, the connection between the fluid inlet and the fluid supply channel in working sealed by a fluid supply sealing element, wherein the holder assembly comprises a recess that, when the nanoreactor is attached to the holder assembly, forms a sealed pre-vacuum volume between the distal end and the first flat layer, the pre-vacuum volume evacuated via a pre-vacuum channel ending in the recess, and the fluid supply sealing element is exposed to the evacuated pre-vacuum volume such that any leakage of the fluid via the fluid supply sealing element is pumped away via the pre-vacuum channel without entering the evacuated part of the electron microscope.

2. The holder assembly of claim 1 in which the holder assembly is equipped to cooperate with a nanoreactor having a fluid outlet for exiting fluid from the enclosed volume, the distal end having a fluid outlet channel sealed to the fluid outlet with a fluid outlet sealing element, the fluid outlet sealing element exposed to the pre-vacuum such that any leakage of the fluid via the fluid outlet sealing element is pumped away via the pre-vacuum channel without entering the evacuated part of the electron microscope.

3. The holder assembly of claim 1 for cooperation with a nanoreactor having a fluid outlet, the fluid outlet taking the form of a leak with a predetermined leak rate between the enclosed volume and the evacuated volume.

4. The holder assembly of claim 1 in which the holder assembly is equipped to cooperate with a nanoreactor of which the first flat layer is sealed to the second flat surface by a sealing member, and the sealing member is exposed to the pre-vacuum such that any leakage of the fluid via the fluid outlet sealing element is pumped away without entering the evacuated part of the electron microscope.

5. The holder assembly of claim 1 in which at least the fluid inlet sealing element comprises an elastomer.

6. The holder assembly of claim 1 further comprising electrical connections for connecting to connection pads on the nanoreactor.

7. The holder assembly of claim 6 in which the electrical connections are used to supply a heating current to the nanoreactor.

8. The holder assembly of claim 2, in which the holder assembly is configured to cooperate with a nanoreactor of which the first flat layer is sealed to the second flat surface by a sealing member, and the sealing member is exposed to the pre-vacuum such that any leakage of the fluid via the fluid outlet sealing element is pumped away without entering the evacuated part of the electron microscope.

9. The holder assembly of claim 8, in which at least the fluid inlet sealing element comprises an elastomer.

10. The holder assembly of claim 8, further comprising electrical connections for connecting to connection pads on the nanoreactor.

11. The holder assembly of claim 3, in which the holder assembly is configured to cooperate with a nanoreactor of which the first flat layer is sealed to the second flat surface by a sealing member, and the sealing member is exposed to the pre-vacuum such that any leakage of the fluid via the fluid outlet sealing element is pumped away without entering the evacuated part of the electron microscope.

12. The holder assembly of claim 2, in which at least the fluid inlet sealing element comprises an elastomer.

13. The holder assembly of claim 12, further comprising electrical connections for connecting to connection pads on the nanoreactor.

14. The holder assembly of claim 3, in which at least the fluid inlet sealing element comprises an elastomer.

15. The holder assembly of claim 4, in which at least the fluid inlet sealing element comprises an elastomer.

16. The holder assembly of claim 2, further comprising electrical connections for connecting to connection pads on the nanoreactor.

17. The holder assembly of claim 3, further comprising electrical connections for connecting to connection pads on the nanoreactor.

18. The holder assembly of claim 4, further comprising electrical connections for connecting to connection pads on the nanoreactor.

19. The holder assembly of claim 5, further comprising electrical connections for connecting to connection pads on the nanoreactor.

* * * * *